United States Patent
Yamaura

(10) Patent No.: US 10,839,112 B2
(45) Date of Patent: Nov. 17, 2020

(54) WIND SIMULATION DEVICE

(71) Applicant: TOYOTA JIDOSHA KABUSHIKI KAISHA, Toyota (JP)

(72) Inventor: Masahiro Yamaura, Mountain View, CA (US)

(*) Notice: Subject to any disclaimer, the term of this patent is extended or adjusted under 35 U.S.C. 154(b) by 0 days.

(21) Appl. No.: 16/506,330

(22) Filed: Jul. 9, 2019

(65) Prior Publication Data
US 2019/0332743 A1    Oct. 31, 2019

Related U.S. Application Data

(63) Continuation of application No. 15/135,135, filed on Apr. 21, 2016, now Pat. No. 10,395,003.

(51) Int. Cl.
*G06F 30/15* (2020.01)
*G06F 11/36* (2006.01)
*G06F 30/20* (2020.01)

(52) U.S. Cl.
CPC .......... *G06F 30/15* (2020.01); *G06F 11/3664* (2013.01); *G06F 30/20* (2020.01)

(58) Field of Classification Search
None
See application file for complete search history.

(56) References Cited

U.S. PATENT DOCUMENTS

| | | | |
|---|---|---|---|
| 2010/0015377 A1* | 1/2010 | Burzio ................. | B60C 99/006 428/36.92 |
| 2012/0105628 A1* | 5/2012 | Fukuchi ................ | G01P 5/22 348/135 |
| 2012/0255350 A1* | 10/2012 | Nobles ................. | G01M 9/067 73/147 |

* cited by examiner

*Primary Examiner* — Craig C Dorais
(74) *Attorney, Agent, or Firm* — Burbage Law, P.C.; Jon-Michael Burbage; Elizabeth Ruzich

(57) ABSTRACT

The disclosure includes a system, method and tangible memory operable to simulate a wind particle. A method may include receiving user input data describing the wind particle. The method may include generating a wind model based on the user input data. The method may include generating a simulation that includes a virtual roadway environment, a virtual wind particle that is configured by the wind model to be variable and dynamic within the virtual roadway environment, a virtual vehicle and a virtualized control software for controlling an operation of the virtual vehicle in the virtual roadway environment and modifying the operation of the virtual vehicle in response to a variable in the simulation. The simulation may be operable to test the virtualized control software and the modifying of the operation of the virtual vehicle in response to the virtual wind particle being the variable in the simulation.

20 Claims, 6 Drawing Sheets

WIND SIMULATION DEVICE

CROSS-REFERENCE TO RELATED APPLICATIONS

This patent application is a continuation of U.S. patent application Ser. No. 15/135,135, entitled "Wind Simulation Device" and filed on Apr. 21, 2016, the entirety of which is hereby incorporated by reference.

BACKGROUND

The specification relates to a wind simulation device. More specifically, some implementations of the specification relate to a wind device to generate a virtual wind particle included in a simulation to test a design of a vehicle control software included in a design for a vehicle. The wind simulation device may generate one or more graphical user interfaces.

Vehicles are designed by design engineers. Design engineers use virtual simulation tools for design space exploration of their vehicle designs, including simulation of the performance of different design choices and evaluation of different design alternatives. Examples of virtual simulation tools suitable for vehicle design include Modelica platforms such as MapleSim.

SUMMARY

Embodiments may include a method, system or non-transitory computer readable medium operable to generate a virtual wind particle included in a simulation to test a design of a vehicle control software included in a design for a vehicle.

A wind simulation device may simulate a wind effect in a physics engine of a virtual simulation tool. Winds may be represented as one or more virtual wind particles that have minimal mass. In some implementations, mesh-free algorithms, such as a Smoothed-Particle Hydrodynamics method (a "SPH" method) or a Moving Particle Semi-implicit method (a "MPS" method), may calculate a path of a virtual wind particle. A physics engine of the virtual simulation tool may determine wind forces that an object receives when a virtual wind particle collides with a virtual object that is simulated by the virtual simulation tool. A box around a target object may be created. The virtual simulation tool may be configured so that the virtual wind particle is only represented when it is present inside the volume formed by the outer edge of the box, thereby improving the performance of a computer system executing the virtual simulation tool by reducing the computational overhead associated with analyzing the entire virtual environment within the simulation.

A system of one or more computers can be configured to perform particular operations or actions by virtue of having software, firmware, hardware, or a combination of them installed on the system that in operation causes or cause the system to perform the actions. One or more computer programs can be configured to perform particular operations or actions by virtue of including instructions that, when executed by data processing apparatus, cause the apparatus to perform the actions.

One general aspect includes a method including: receiving user input data describing a wind particle; generating, by a wind simulation module executed by a processor, a wind model based on the user input data, where the wind model includes software for virtualizing the wind particle; and generating, by a virtual simulation tool executed by the processor, a simulation that includes a virtual roadway environment, a virtual wind particle that is configured by the wind model to be variable and dynamic within the virtual roadway environment when the simulation is executed, a virtual vehicle and a virtualized control software for controlling an operation of the virtual vehicle in the virtual roadway environment and modifying the operation of the virtual vehicle in response to a variable in the simulation, where the simulation is operable to test the virtualized control software and the modifying of the operation of the virtual vehicle in response to the virtual wind particle in the simulation, where the user input data includes box data describing a volume of analysis that includes a three dimensional volume inside of the virtual roadway environment and the volume of analysis includes the virtual vehicle but not all of the virtual roadway environment. Other embodiments of this aspect include corresponding computer systems, apparatus, and computer programs recorded on one or more computer storage devices, each configured to perform the actions of the methods.

Implementations may include one or more of the following features. The method where the wind simulation module is an element of the virtual simulation tool. The method where the wind simulation module is a plug-in included in the virtual simulation tool. The method further including: executing the simulation so that the virtual vehicle, the virtualized control software and the virtual wind particle are dynamic in the virtual roadway environment; and monitoring, by the wind simulation module, an outer edge of the volume of analysis to determine whether the virtual wind particle is present inside the volume of analysis. The method where the outer edge is configured so that the wind simulation module monitors less of the virtual roadway environment so that the test of the virtualized control software requires less computations than monitoring each pixel of the virtual roadway environment. The method further including: responsive to detecting the virtual wind particle being present inside the volume of analysis, tracking the virtual wind particle to determine whether the virtual wind particle collides with the virtual vehicle; detecting the virtual wind particle collide with the virtual vehicle; and determining (1) wind force data describing a simulated wind force caused by the virtual wind particle colliding with the virtual vehicle and (2) vehicle effect data describing an effect of the simulated wind force on the virtual vehicle. The method further including: monitoring a response of the virtualized control software to the effect of the simulated wind force on the virtual vehicle; and storing control software response data describing the response. The method further including: analyzing the control software response data to determine whether the virtualized control software responded in a way that conforms with a specification for a vehicle control software represented in the simulation by the virtualized control software. Implementations of the described techniques may include hardware, a method or process, or computer software on a computer-accessible medium.

One general aspect includes a non-transitory memory including computer code which, when executed by a processor, causes the processor to perform steps including: receiving user input data describing a wind particle; generating a wind model based on the user input data, where the wind model includes software for virtualizing the wind particle; and generating a simulation that includes a virtual roadway environment, a virtual wind particle that is configured by the wind model to be variable and dynamic within the virtual roadway environment when the simulation is executed, a virtual vehicle and a virtualized control software for controlling an operation of the virtual vehicle in the virtual roadway environment and modifying the operation of the virtual vehicle in response to a variable in the simulation, where the simulation is operable to test the virtualized control software and the modifying of the operation of the virtual vehicle in response to the virtual wind particle in the simulation, where the user input data includes box data describing a volume of analysis that includes a three dimensional volume inside of the virtual roadway environment and the volume of analysis includes the virtual vehicle but not all of the virtual roadway environment. Other embodiments of this aspect include corresponding computer systems, apparatus, and computer programs recorded on one or more computer storage devices, each configured to perform the actions of the methods.

Implementations may include one or more of the following features. The non-transitory memory where the computer code, when executed by the processor, causes the processor to perform additional steps including: executing the simulation so that the virtual vehicle, the virtualized control software and the virtual wind particle are dynamic in the virtual roadway environment; and monitoring an outer edge of the volume of analysis to determine whether the virtual wind particle is present inside the volume of analysis. The non-transitory memory where the outer edge is configured so that less of the virtual roadway environment is monitored so that the test of the virtualized control software requires less computations than monitoring each pixel of the virtual roadway environment. The non-transitory memory where the computer code, when executed by the processor, causes the processor to perform additional steps including: responsive to detecting the virtual wind particle being present inside the volume of analysis, tracking the virtual wind particle to determine whether the virtual wind particle collides with the virtual vehicle; detecting the virtual wind particle collide with the virtual vehicle; and determining (1) wind force data describing a simulated wind force caused by the virtual wind particle colliding with the virtual vehicle and (2) vehicle effect data describing an effect of the simulated wind force on the virtual vehicle. The non-transitory memory where the computer code, when executed by the processor, causes the processor to perform additional steps including: monitoring a response of the virtualized control software to the effect of the simulated wind force on the virtual vehicle; and storing control software response data describing the response. The non-transitory memory where the computer code, when executed by the processor, causes the processor to perform additional steps including: analyzing the control software response data to determine whether the virtualized control software responded in a way that conforms with a specification for a vehicle control software represented in the simulation by the virtualized control software; and modifying the vehicle control software responsive to determining that the control software response data does not conform to the specification. The non-transitory memory where the computer code, when executed by the processor, causes the processor to output a graphical user interface that depicts the control software response data. Implementations of the described techniques may include hardware, a method or process, or computer software on a computer-accessible medium.

One general aspect includes a system including: a processor, a monitor; and a non-transitory memory storing a virtual simulation tool that includes a wind simulation module, where the processor is communicatively coupled to the non-transitory memory to execute the virtual simulation tool and the wind simulation module and generate an output for display on the monitor, where, responsive to being executed by the processor, the wind simulation module causes the processor to generate an input graphical user interface configured to receive user input data describing a wind particle and generate a wind model based on the user input data, where the wind model includes software for virtualizing the wind particle; where, responsive to being executed by the processor, the virtual simulation tool generates a simulation for display on the monitor that includes a virtual roadway environment, a virtual wind particle that is configured by the wind model to be variable and dynamic within the virtual roadway environment of the simulation, a virtual vehicle and a virtualized control software for controlling an operation of the virtual vehicle in the virtual roadway environment and modifying the operation of the virtual vehicle in response to a variable in the simulation, where the simulation is operable to test the virtualized control software and the modifying of the operation of the virtual vehicle in response to the virtual wind particle being the variable in the simulation, where the user input data includes box data describing a volume of analysis that includes a three dimensional volume inside of the virtual roadway environment and the volume of analysis includes the virtual vehicle but not all of the virtual roadway environment; and where the wind simulation module, responsive to being executed by the processor, monitors the volume of analysis to determine whether the virtualized control software responds to the virtual wind particle in a way that conforms to a specification of a vehicle control software that is represented in the simulation by the virtualized control software. Other embodiments of this aspect include corresponding computer systems, apparatus, and computer programs recorded on one or more computer storage devices, each configured to perform the actions of the methods.

Implementations may include one or more of the following features. The system where the wind simulation module is a plug-in included in the virtual simulation tool. The system where the virtual simulation tool is a Modelica-based simulation tool. The system where monitoring the volume of analysis includes monitoring, by the wind simulation module, an outer edge of the volume of analysis to determine whether the virtual wind particle is present inside the volume of analysis. The system where the outer edge is configured so that the wind simulation module monitors less of the virtual roadway environment so that the test of the virtualized control software requires less computations than monitoring each pixel of the virtual roadway environment. Implementations of the described techniques may include hardware, a method or process, or computer software on a computer-accessible medium.

BRIEF DESCRIPTION OF THE DRAWINGS

The disclosure is illustrated by way of example, and not by way of limitation in the figures of the accompanying drawings in which like reference numerals are used to refer to similar elements.

DETAILED DESCRIPTION

Vehicles are designed by design engineers. Design engineers use virtual simulation tools for design space exploration of their vehicle designs, including simulation of the performance of different design choices and evaluation of different design alternatives. Examples of virtual simulation tools suitable for vehicle design include Modelica platforms such as MapleSim.

A virtual simulation tool may be used to evaluate the performance of individual vehicle subsystems. One example of a vehicle subsystem that may be evaluated using a vehicle simulation tool is the Advanced Driver Assistance System (herein "ADAS system"). A virtual simulation tool may also be used to evaluate the software the controls the driving of an autonomous vehicle. The ADAS system and the software that controls the driving of an autonomous vehicle may be generally classified as "vehicle control systems" or "vehicle control software."

Figure 1:
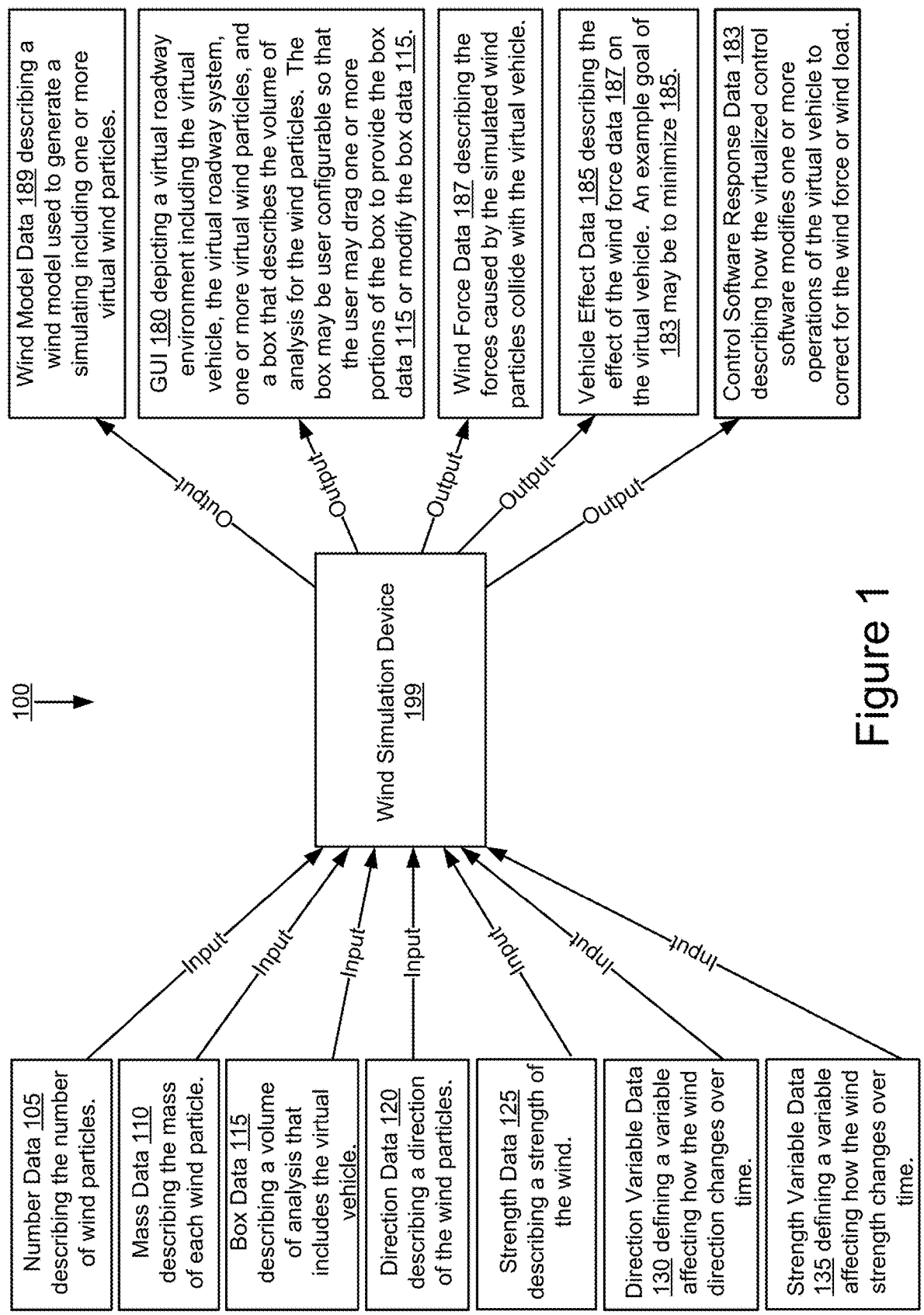
FIG. 1 is a block diagram illustrating an example process flow for a wind simulation device, according to some implementations.

FIG. 1 is a block diagram illustrating an example process flow 100 for a wind simulation device 199, according to some implementations.

The wind simulation device 199 may include a virtual simulation tool, a non-transitory memory and a processor. The virtual simulation tool may include a Modelica-based simulation tool such as CarSim, MapleSim or some other virtual simulation tool. The virtual simulation tool may be stored in the non-transitory memory. The virtual simulation tool may be accessible and executable by the processor. The non-transitory memory may store other data. For example, the non-transitory memory may store a vehicle model for a vehicle design. The vehicle design may include a proposed design for a vehicle. The vehicle design may include a proposed design for an automated vehicle. The vehicle design may include a proposed design for a vehicle that includes a vehicle control software such as an ADAS system. The non-transitory memory may store a software model for the vehicle control software.

In some implementations, the wind simulation device 199 may generate a simulation. The simulation may be operable to test a performance of the vehicle design. For example, the simulation may include one or more of the following: a virtual roadway environment that is simulated based on the roadway environment model; a virtual vehicle that is simulated based on the vehicle model; and a virtualized version of the vehicle control software (i.e., "virtualized control software") that is simulated based on the software model. The virtual vehicle may drive along a virtual roadway that is present in the virtual roadway environment. The virtualized control software may control one or more operations of the virtual vehicle. For example, the virtualized control software may control one or more of the following: the steering of the virtual vehicle; the breaking of the virtual vehicle; the speed of the virtual vehicle; the acceleration of the virtual vehicle; and the gear shifting of the virtual vehicle. The virtual roadway environment may include one or more static or dynamic objects. The virtualized control software may modify one or more operations of the virtual vehicle to respond to the one or more static or dynamic objects. For example, the dynamic object may include a simulated animal crossing the virtual roadway in the path of the virtual vehicle and the virtualized control software may cause the virtual vehicle to brake in order avoid a collision with the virtual animal. Other dynamic objects are possible.

The simulation may be operable to test the performance of the vehicle control software. For example, the simulation may be operable to test whether the virtualized control software meets one or more requirements of a specification for the vehicle control software, a regulation that is applicable to the vehicle control software or a standard that is applicable to the vehicle control software.

In some implementations, the wind simulation device 199 may be operable to include one or more virtual wind particles in the simulation. The wind simulation device 199 may test the performance of the virtualized control software (which simulates the vehicle control software) in response to the one or more virtual wind particles that are included in the simulation. For example, the one or more virtual wind particles may collide with the virtual vehicle, resulting in a wind load. The wind load may modify the course or trajectory of the virtual vehicle in the simulation similar to how a wind load in the real world may modify the course or trajectory of a real world vehicle. The simulation may test whether the virtualized control software is able to change the course or trajectory of the virtual vehicle to correct for the wind load.

The wind simulation device 199 is described in more detail below with reference to FIG. 2.

The wind simulation device 199 may receive one or more of the following inputs: number data 105; mass data 110; box data 115; direction data 120; strength data 125; direction variable data 130; and strength variable data 135. One or more of these inputs may be referred to collectively as "user input data." See, for example, the user input data 290 described below with reference to FIG. 2.

In some implementations, a human user of the wind simulation device 199 may provide the user input data. For example, the human user may provide the user input data via a keyboard, mouse, touchscreen or some other peripheral that is communicatively coupled to the wind simulation device 199, an element of the wind simulation device 199 or a processor-based computing device (e.g., a computer) that executes the wind simulation device 199.

The human user may include a vehicle design engineer. The vehicle design engineer may include the designer of the vehicle design that includes the vehicle control software.

The number data 105 may include data describing a number of wind particles to be included in a simulation provided by the wind simulation device 199. For example, the number data 105 may describe a number of simulated wind particles included in a simulation that is operable to test a performance of a vehicle design that includes a vehicle control software. For example, the vehicle design is for a vehicle that includes an ADAS system or some other vehicle control software that is operable to control one or more operations of the vehicle. In another example, the vehicle design may be for an autonomous vehicle and the vehicle control software may include the software that controls one or more operations of the autonomous vehicle.

The mass data 110 may include data describing a mass of each wind particle included in the simulation. For example, the mass data 110 may describe a mass of one or more simulated wind particles. The mass data 110 may specify different masses for different wind particles.

The box data 115 may describe a volume of analysis that includes a virtual vehicle. For example, with reference to FIG. 4, a graphical user interface ("GUI") 400 is depicted that includes a virtual roadway environment, a virtual vehicle and a box that defines a portion of the virtual roadway environment that includes the virtual vehicle. The box may be referred to herein as a "volume of analysis 410."

In some implementations, the GUI 400 may include an input GUI that is used to enable a human user to provide the box input via the GUI 400. For example, the human user may draw the box using their finger, a stylus, mouse, keystrokes, or some other device. For example, the GUI 400 may be displayed on a touchscreen and the human user may draw the box by drawing the box or a portion of the box on the touchscreen.

In some implementations, the box may be configured so that it includes a threshold volume. For example, the box may be configured so that it includes a multiple of the volume of the virtual vehicle. For example, the box may be configured so that it includes 1.5×, 2×, 3× or 4× of a volume of the virtual vehicle (or some other multiple that is greater that one). In this way, the box may be automatically generated by the wind simulation device 199 in some implementations. For example, the human user may provide the multiple (e.g., "3×") as the box data 115 and the wind simulation device 199 may generate the box based on the box data 115 and a vehicle model for the virtual vehicle that includes data describing the volume of the virtual vehicle or is sufficient for the wind simulation device 199 to calculate the volume of the virtual vehicle.

Referring back to FIG. 1, the direction data 120 may describe a direction of the wind particles. For example, the direction data 120 may describe a heading of one or more virtual wind particles in the simulation. For example, the direction data 120 may describe a relative direction of travel of a virtual wind particle dynamically moving in a simulation relative to some fixed object (e.g., an egocentric coordinate), a cardinal direction (e.g., North, South, East, West) of a virtual wind particle dynamically moving in a simulation, an intermediate direction (e.g., North-West, North-East, South-West, South-East) dynamically moving in a simulation, a direction of a vector or some other data that describes a direction of a wind particle dynamically moving in a simulation.

The strength data 125 may describe a strength of the wind or a wind particle. For example, the strength data 125 may describe a strength of a virtual wind particle dynamically moving in a simulation.

In some implementations, the strength data 125 may describe a velocity for one or more virtual wind particles included in the simulation. For example, the strength data 125 may describe how far a virtual wind particle travels (10 meters, 60 meters, etc.) in the simulation during some measurement of time (e.g., one second, one minute, one hour). In some implementations, strength data 125 may be measured in knots, miles per hour, meters per second or some other standard for measuring velocity for wind.

In some implementations, the strength data 125 may describe a wind load for one or more virtual wind particles included in the simulation.

In some implementations, the strength data 125 may describe a force for one or more of the virtual wind particles included in the simulation.

The direction variable data 130 may describe a variable affecting how the wind direction changes over time. For example, the direction variable data 130 may describe how a direction described by the direction data 120 may vary over time within the simulation. For example, the simulation may include a wind particle traveling in a North-bound direction at time "X," but at time "Y" the wind particle may be traveling in a North-West bound direction. This variation may be described or determined based on the direction variable data 130.

In some implementations, the direction variable data 130 may describe a function or some other input that describes the variation of the direction of the wind (or one or more virtual wind particles) in the simulation.

In some implementations, the direction variable data 130 may be a seed for a random number generator that controls the variation of the direction of the wind (or one or more virtual wind particles) in the simulation.

The strength variable data 135 may describe a variable affecting how the strength of the wind changes over time. For example, the strength variable data 135 may describe how a velocity of a virtual wind particle may vary over time within the simulation. For example, the simulation may include a wind particle traveling at 5 meters per second at time "X," but at time "Y" the wind particle may be traveling at 24 meters per second. This variation may be described or determined based on the strength variable data 135.

In some implementations, the strength variable data 135 may describe a function or some other input that describes the variation of the strength of the wind (or one or more virtual wind particles) in the simulation.

In some implementations, the strength variable data 135 may be a seed for a random number generator that controls the variation of the strength of the wind (or one or more virtual wind particles) in the simulation.

The wind simulation device 199 may generate one or more of the following outputs based at least in part on one or more of the user inputs: wind model data 189; a GUI 180; wind force data 187; vehicle effect data 185; and control software response data 183. One or more of these outputs may be referred to collectively as "system output data." See, for example, the system output data 298 described below with reference to FIG. 2.

The wind model data 189 may describe a wind model used to simulate one or more wind particles. For example, the wind model may include data used by the wind simulation device 199 to generate a simulation that includes the one or more wind particles. The wind simulation device 199 may generate the wind model data 189 based on the user input data. The simulation may be generated by a wind simulation module that is an element of the wind simulation device 199. The wind simulation module may be an element of a virtual simulation tool or a standalone software. In some implementations, the wind simulation module may be a plug-in of the virtual simulation tool. The virtual simulation tool may be an element of the wind simulation device 199.

In some implementations, the virtual simulation tool may receive the wind model data 189 as an input and generate a simulation based on the wind model data 189. The simulation may also be based on a vehicle model, a software model and a roadway environment model. For example, the simulation generated by the virtual simulation tool may include a virtual roadway environment, a virtual wind particle that is configured by the wind model data 189 to be variable and dynamic within the virtual roadway environment when the simulation is executed, a virtual vehicle and a virtualized control software for controlling an operation of the virtual vehicle in the virtual roadway environment and modifying the operation of the virtual vehicle in response to a variable in the simulation. The simulation may be operable to test the virtualized control software. For example, the simulation may test the modifying of the operation of the virtual vehicle by the virtualized control software in response to the virtual wind particle in the simulation colliding with the virtual vehicle.

The virtual simulation tool may generate an executable file that is stored on a non-transitory memory of the wind simulation device 199. A processor of the wind simulation device 199 may access the executable file on the non-transitory memory. The processor may execute the executable file. The execution of the executable file may cause the processor to generate a simulation. For example, the processor may generate one or more GUIs 180 that graphically depict the simulation.

Figure 5:
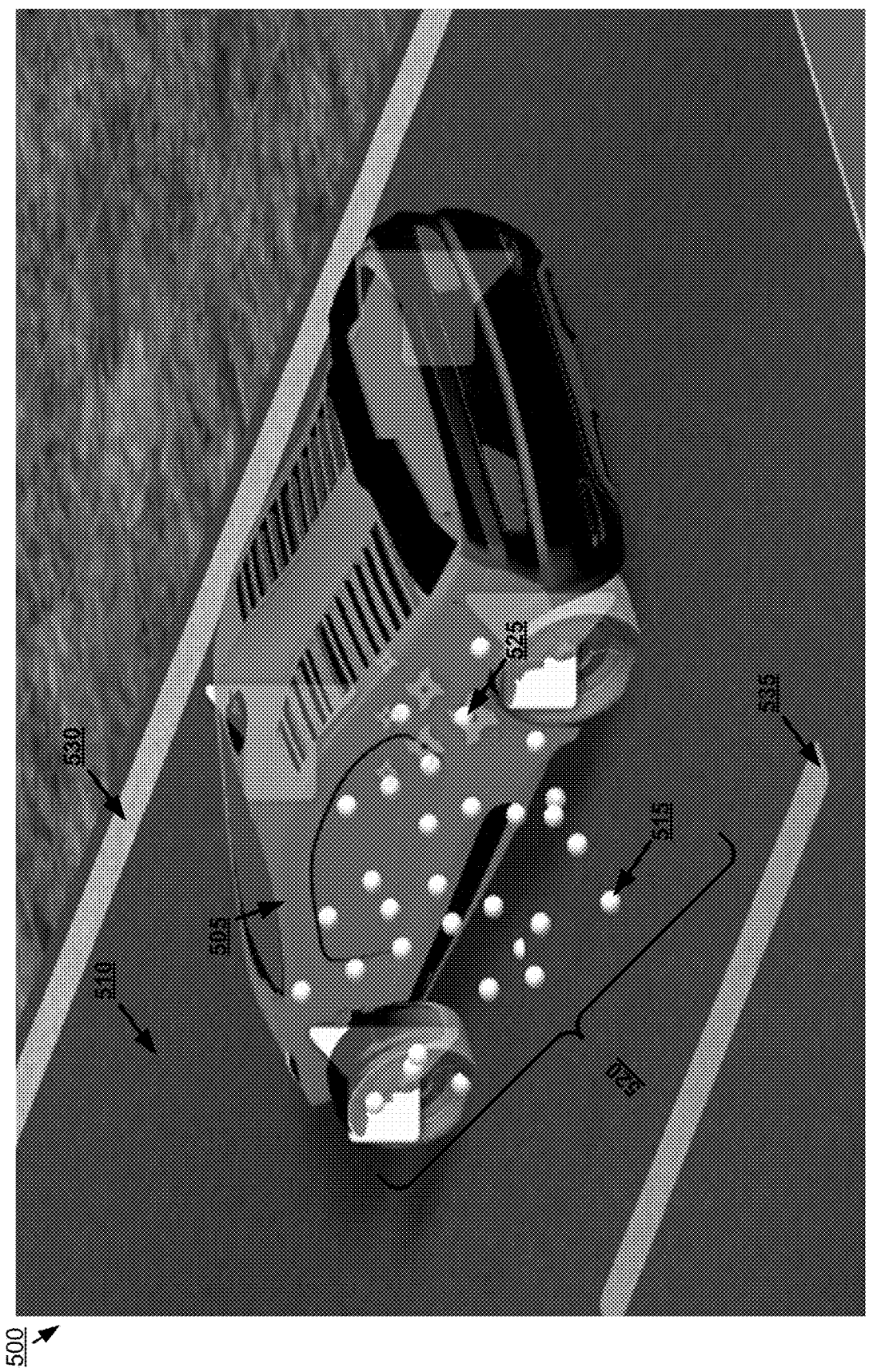
FIG. 5 is an example of a graphical user interface depicting a simulation including a plurality of virtual wind particles, according to some implementations.

The GUI 180 may be displayed on a monitor or a display. An example of the GUI 180 according to some implementations is shown in FIG. 5. The GUI 180 may graphically depict one or more of the following: the virtual vehicle; a virtual roadway system; one or more virtual obstacles; one or more virtual wind particles; and a box that describes a volume of analysis.

Referring back to FIG. 1, the wind force data 187 may describe a simulated wind force or wind load caused by one or more simulated wind particles colliding with the virtual vehicle. The virtual vehicle may be in motion (e.g., driving on the virtual roadway) at the time of the collision. The virtual vehicle may have a path or trajectory that may be modified by the simulated wind force or wind load.

The vehicle effect data 185 may describe an effect of the simulated wind force or wind load on a path or trajectory of the virtual vehicle following collision.

In some implementations, a goal of the virtualized control software may be to minimize the vehicle effect data 185. For example, the goal may include the path or trajectory of the virtual vehicle remaining unchanged or substantially unchanged following the collision, thereby indicating that the virtualized control software accurately corrected for the wind force or wind load. In some implementations, the vehicle control software passes the test of the simulation if the path or trajectory of the virtual vehicle is unchanged or substantially unchanged following the collision.

The control software response data 183 may describe how the virtualized control software responded to the wind force or the wind load described by the wind force data 187. For example, the control software response data 183 may describe how the path or trajectory of the virtual vehicle changed to correct for the wind force or the wind load. The control software response data 183 may also describe other operational changes implemented by the virtualized control software responsive to the wind force or wind load. For example, the control software response data 183 may describe a change in acceleration, a change in velocity, a change in a lane of travel or any other change implemented by the virtualized control software in order to correct for the wind force or the wind load.

In some implementations, the wind simulation device 199 may output one or more suggested modifications for the vehicle control software responsive to an analysis of one or more simulations.

In some implementations, the wind simulation device 199 can be implemented using hardware including a field-programmable gate array ("FPGA") or an application-specific integrated circuit ("ASIC"). In some other implementations, the wind simulation device 199 can be implemented using a combination of hardware and software. The wind simulation device 199 may be stored in a combination of the devices and servers, or in one of the devices or servers. The wind simulation device 199 may include code and routines configured to perform one or more steps of the method 300 described below with reference to FIGS. 3A and 3B when executed by a processor, such as processor 225, described below with reference to FIG. 2.

Example Electronic Device

Figure 2:
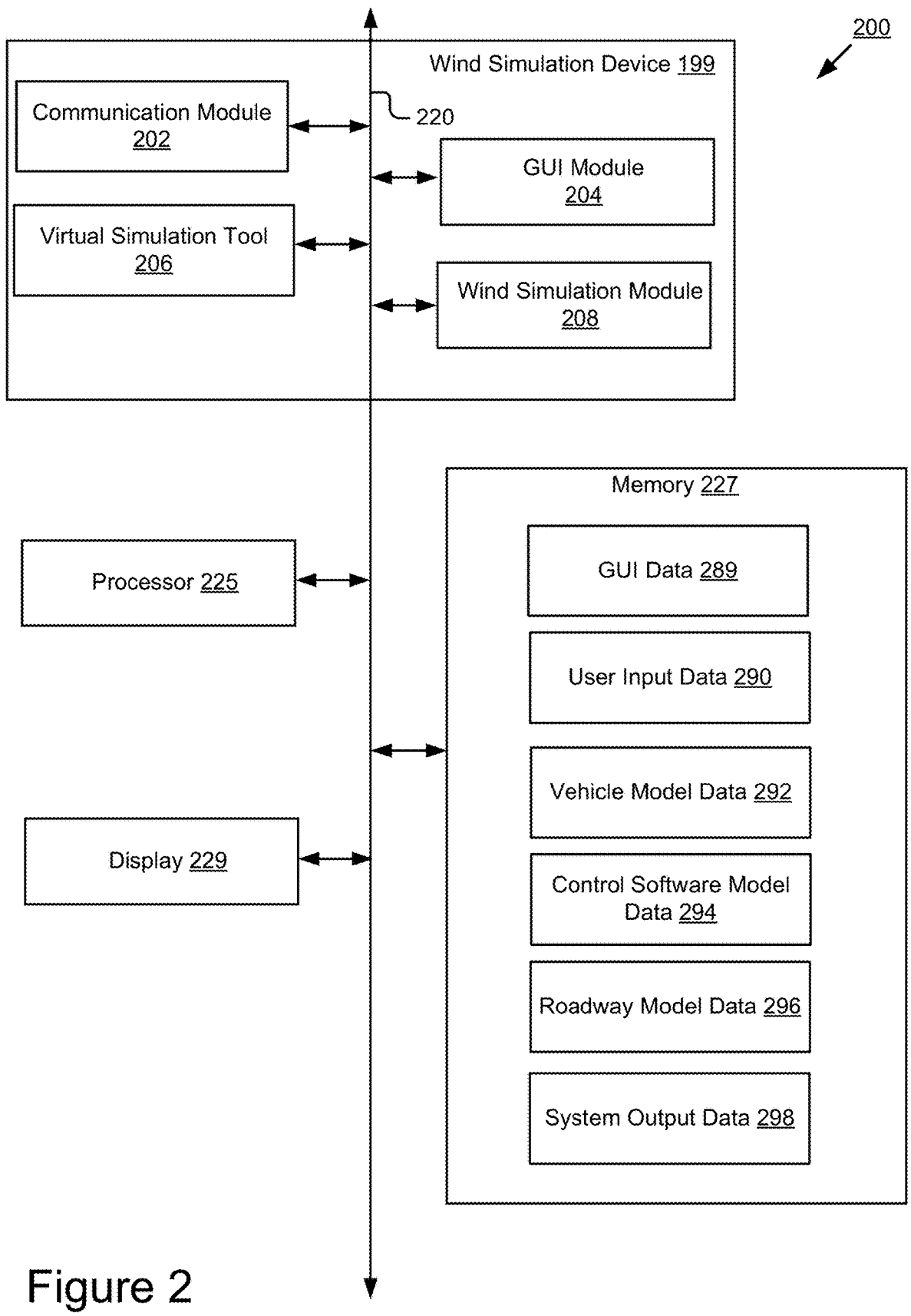
FIG. 2 is a block diagram illustrating an example computer system including a wind simulation device according to some implementations.

FIG. 2 is a block diagram illustrating an example computer system 200 including a wind simulation device 199 according to some implementations. In some implementations, the wind simulation device 199 may include an electronic device programmed or configured to perform one or more blocks of the method 300 described below with reference to FIGS. 3A and 3B. In some implementations, the computer system 200 may include a special-purpose computing device configured to provide some or all of the functionality described above with reference to the wind simulation device 199 or below with reference to method 300.

The computer system 200 may include one or more of the following elements: the wind simulation device 199; a processor 225; a memory 227; and a display 229. The components of the computer system 200 may be communicatively coupled by a bus 220. In some embodiments, the components of the computer system 200 are local to the same hardware so that the bus 220 is not necessary for communication among the components of the computer system 200. In some embodiments, communication structures or methods other than the bus 220 may be implemented.

The processor 225 includes an arithmetic logic unit, a microprocessor, a general-purpose controller, or some other processor array to perform computations and provide electronic display signals to a display device. The processor 225 processes data signals and may include various computing architectures including a complex instruction set computer (CISC) architecture, a reduced instruction set computer (RISC) architecture, or an architecture implementing a combination of instruction sets. Although FIG. 2 includes a single processor 225, multiple processors 225 may be included. The processor 225 may include a graphical processing unit. Other processors, operating systems, sensors, displays, and physical configurations may be possible.

The display 229 is an electronic device configured for the visual presentation of data. For example, the display 229 may be configured for the visual presentation of the GUI data 289. The display 229 may receive the GUI data 289 and output a GUI (e.g., the input GUI 400 or the output GUI 500).

The memory 227 is a tangible or non-transitory storage medium that stores instructions or data that may be accessed and executed by the processor 225. The instructions or data may include code for performing the techniques described herein. The memory 227 may include a dynamic random access memory (DRAM) device, a static random access memory (SRAM) device, flash memory, or some other memory device. In some implementations, the memory 227 also includes a non-volatile memory or similar permanent storage device and media including a hard disk drive, a floppy disk drive, a CD-ROM device, a DVD-ROM device, a DVD-RAM device, a DVD-RW device, a flash memory device, or some other mass storage device for storing information on a more permanent basis.

The memory 227 may include one or more of the following elements: GUI data 289; user input data 290; vehicle model data 292; control software model data 294; roadway model data 296; and system output data 298. The memory may store other data not depicted in FIG. 2. For example, the memory 227 may store a model used to generate a virtual roadway environment, one or more models used to generate one or more virtual dynamic objects, one or more models used to generate one or more virtual static objects or any other data used to generate a simulation that includes one or more virtual wind particles. The memory 227 may store any data or information necessary for the wind simulation device 199 to provide its functionality.

The GUI data 289 may include graphical data for generating one or more GUIs. For example, the GUI data 289 may include graphical data for generating the input GUI 400 or the output GUI 500. In some implementations, the GUI data 289 may include graphical data for causing the display 229 to graphically depict the simulation.

The user input data 290 may include any data used to generate the system output data 298 or the GUI data 289. For example, the user input data 290 may include one or more of the following described above with reference to FIG. 1: the number data 105; the mass data 110; the box data 115; the direction data 120; the strength data 125; the direction variable data 130; and the strength variable data 135.

In some implementations, one or more of the following elements may be included in the user input data 290: the vehicle model data 292; the control software model data 294; the roadway model data 296; roadway environment data (not pictured) that describes a model used to generate a virtual roadway environment; virtual dynamic object model data (not pictured) that describes one or more models used to generate one or more virtual dynamic objects; and virtual static object data (not pictured) that describes one or more models used to generate one or more virtual static objects.

An example of a virtual dynamic object may include another virtual vehicle driving on a virtual roadway system, a virtual pedestrian walking in the virtual roadway environment, a moving object or animal included in the virtual roadway environment, a virtual traffic signal included in the virtual roadway environment, etc.

An example of a virtual static object may include a virtual tree included in the virtual roadway environment, a virtual traffic sign included in the virtual roadway environment, etc.

The vehicle model data 292 may describe a real world vehicle that is represented by the virtual vehicle in the simulation. The vehicle model data 292 may describe a model used by the wind simulation device 199 (or the virtual simulation tool 206) to generate the virtual vehicle. The vehicle model data 292 may describe one or more vehicle parameters for the real world vehicle represented by the virtual vehicle in the simulation. For example, the vehicle model data 292 may include vehicle parameter data that describes more or more physical measurements of one or more elements of the real world vehicle, one or more physical properties of the one or more elements of the real world vehicle, etc. The vehicle parameter data may describe the real world vehicle in sufficient detail for the virtual simulation tool 206 to generate the virtual vehicle. In some implementations, the vehicle parameter data may describe the real world vehicle in sufficient detail for the real world vehicle to be built in the real world based on the vehicle parameter data. In some implementations, the vehicle parameter data may include a vehicle design for a proposed real world vehicle.

In some embodiments, the vehicle parameter data may describe one or more of the following: a suspension of a real world vehicle; kinematics of the real world vehicle; compliances of the real world vehicle; rollover thresholds of the real world vehicle; inertias of the real world vehicle; mass center locations of the real world vehicle; and software specifications of the real world vehicle.

In some embodiments, the vehicle parameter data may include any data necessary for the virtual simulation tool 206 to provide its functionality. For example, the vehicle parameter data may include one or more of the inputs necessary to generate a virtual vehicle in the simulation that represents the real world vehicle in the simulation.

The control software model data 294 may describe a vehicle control software of the real world vehicle that is represented by the virtualized control software in the simulation. The control software model data 294 may describe a model used by the wind simulation device 199 (or the virtual simulation tool 206) to generate the virtualized control software and simulate the performance of the vehicle control software in the simulation. The control software model data 294 may describe a software specification of the vehicle control software. The control software model data 294 may describe the code and routines that are included on the vehicle control software. For example, the control software model data 294 may describe how the vehicle control software would respond to dynamic or static objects in the roadway environment that are detected by one or more vehicle sensors of the real world vehicle. For example, the control software model data 294 may describe how the vehicle control software would modify one or more operations of the real world vehicle in response to a wind force or a wind load in the real world. In some implementations, the control software model data 294 may be a subset of the vehicle model data 292.

The roadway model data 296 may describe a virtual roadway system. The virtual roadway system may include one or more virtual roads upon which the virtual vehicle travels in the simulation. The roadway model data 296 may describe the parameters of the virtual roadway system including the physical properties and physical dimensions of the virtual roadway system. Optionally, the roadway model data 296 include data describe the virtual roadway environment, including, for example, one or more virtual dynamic objects and one or more static objects.

The system output data 298 may include one or more of the following described above with reference to FIG. 1: the wind model data 189; the GUI 180; the wind force data 187; the vehicle effect data 185; and the control software response data 183.

In some implementations, the wind simulation device 199 includes one or more of the following: a communication module 202; a GUI module 204; a virtual simulation tool 206; and a wind simulation module 208. These elements of the wind simulation device 199 may be communicatively coupled to the bus 220.

The communication module 202 may include code and routines configured to handle communications between the wind simulation device 199 and other components of the computer system 200. In some implementations, the communication module 202 can be stored in the memory 227 of the computer system 200 and can be accessible and executable by the processor 225.

In some embodiments, the communication module 202 receives data from components of the wind simulation device 199 and stores the data in the memory 227. For example, the communication module 202 receives the wind model data 189 generated by the wind simulation module 208 and stores the wind model data 189 in the memory 227 as a subset of the system output data 298.

The GUI module 204 may include code and routines operable to generate one or more GUIs, such as the input GUI 400 or the output GUI 500, based at least in part on the GUI data 289. In some implementations, the GUI module 204 can be stored in the memory 227 of the computer system 200 and can be accessible and executable by the processor 225.

The virtual simulation tool 206 may include code and routines operable to generate a simulation based at least in part on one or more of the following: the GUI data 289; the user input data 290; the vehicle model data 292; the control software model data 294; the roadway model data 296; and the system output data 298.

In some implementations, the virtual simulation tool 206 may include a Modelica-based virtual simulation tool. For example, the virtual simulation tool 206 may include a software such as MapleSim (produced by Maplesoft of Waterloo, Ontario) or some other Modelica platform.

In some implementations, the virtual simulation tool 206 may include a physics engine or a game engine. In some implementations, the processor 225 or the computer system 200 may include a physics processing unit.

In some implementations, the virtual simulation tool 206 may be a separate element of the computer system 200. For example, the virtual simulation tool 206 may include a standalone software. In some implementations, the virtual simulation tool 206 can be stored in the memory 227 of the computer system 200 and can be accessible and executable by the processor 225.

The wind simulation module 208 may include code and routines operable to receive the user input data 290 and generate some or all of the system output data 298 based at least in part on some or all of the user input data 290.

In some implementations, the wind simulation module 208 may generate the wind model data 189 based at least in part on the user input data 290. For example, the wind simulation module 208 may include code and routines operable to assist the virtual simulation tool 206 to simulate one or more virtual wind particles based on the wind model data 189. In this way, the wind simulation module 208 may beneficially improve the performance of the virtual simulation tool 206. For example, no existing virtual simulation tool 206 includes functionality to simulate one or more wind particles. This is problematic since it is impossible to completely test a performance of a vehicle control software included in a vehicle design without testing how the vehicle control software will respond to wind forces or wind loads. The wind simulation module 208 may solve this problem by enabling the virtual simulation tool 206 to generate a simulation that includes one or more virtual wind particles.

In some implementations, the wind simulation module 208 may be a plug-in for the virtual simulation tool 206. For example, the wind simulation module 208 may include a plug-in installed in a Modelica-based software that beneficially enables the Modelica-based software to generate a simulation that includes one or more virtual wind particles.

In some implementations, the wind simulation module 208 may cause the virtual simulation tool to generate one or more input GUIs that include fields, slides, user-configurable graphical elements and other graphical input elements that are operable to allow a user of the computer system 200 to provide the user input data 290. For example, the input GUI may include one or more graphical input fields which the user may use to provide inputs that describe the user input data 290.

Figure 4:
FIG. 4 is an example of a graphical user interface depicting a volume of analysis, according to some implementations.

An example of a user input GUI may include the input GUI 400 depicted in FIG. 4. For example, the input GUI 400 may include a user-configurable graphical element that enables a human user to provide the box data 115. The wind simulation module 208 may further improve the performance of the virtual simulation tool 206 by providing the box (e.g., element 410 of FIG. 4) that limits how much of the virtual roadway environment must be analyzed for the effects of wind forces or wind loads.

In some implementations, the memory 227 may store data that describes a specification for the vehicle control software. The wind simulation module 208 may include code and routines that are operable to analyze the system output data 298 and determine whether the virtualized control software passed the test of the simulation. If the virtualized control software does not pass the test, the wind simulation module 208 may analyze the specification of the vehicle control software and the system output data 298 to identify one or more parameters of the specification that may be changed so that the system output data 298 indicates a passing test. For example, the wind simulation module 208 may include code and routines that are operable to perform a reachability analysis to determine which portions of the specification should be changed in order for the control software response data 183 to describe one or more modifications for one or more vehicle operations that would have resulted in the vehicle effect data 185 being minimized (e.g., zero or substantially zero), thereby indicating that the virtualized control software completely or substantially corrected for the simulated wind force or wind load caused by the one or more virtualized wind particles colliding with the virtual vehicle.

In some implementations, the wind simulation module 208 can be stored in the memory 227 of the computer system 200 and can be accessible and executable by the processor 225.

Example Methods

Figure 3A:
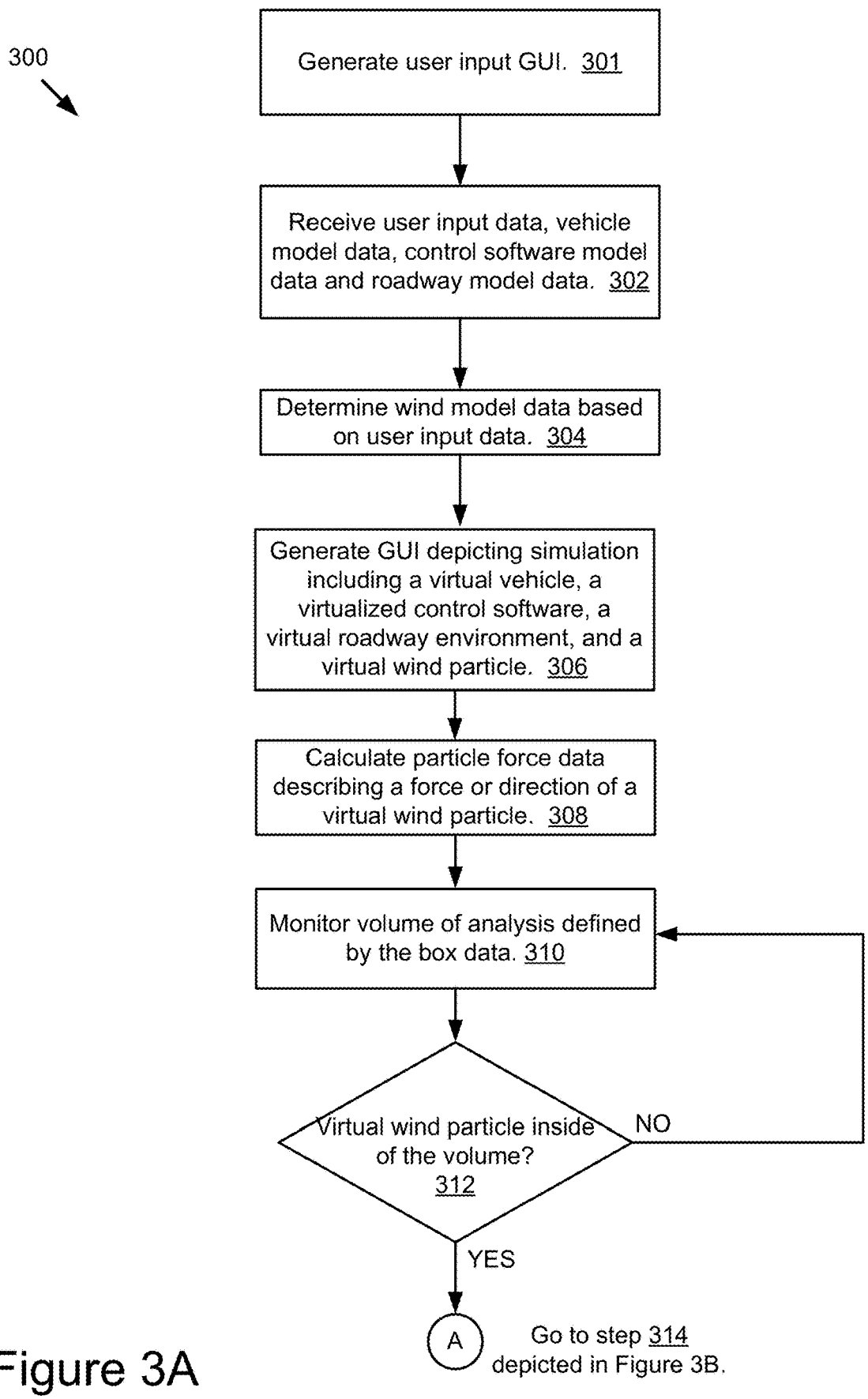
FIGS. 3A and 3B are a flowchart of an example method for generating a virtual wind particle for inclusion in a simulation for testing a design of a vehicle including vehicle control software, according to some implementations.
Figure 3B:
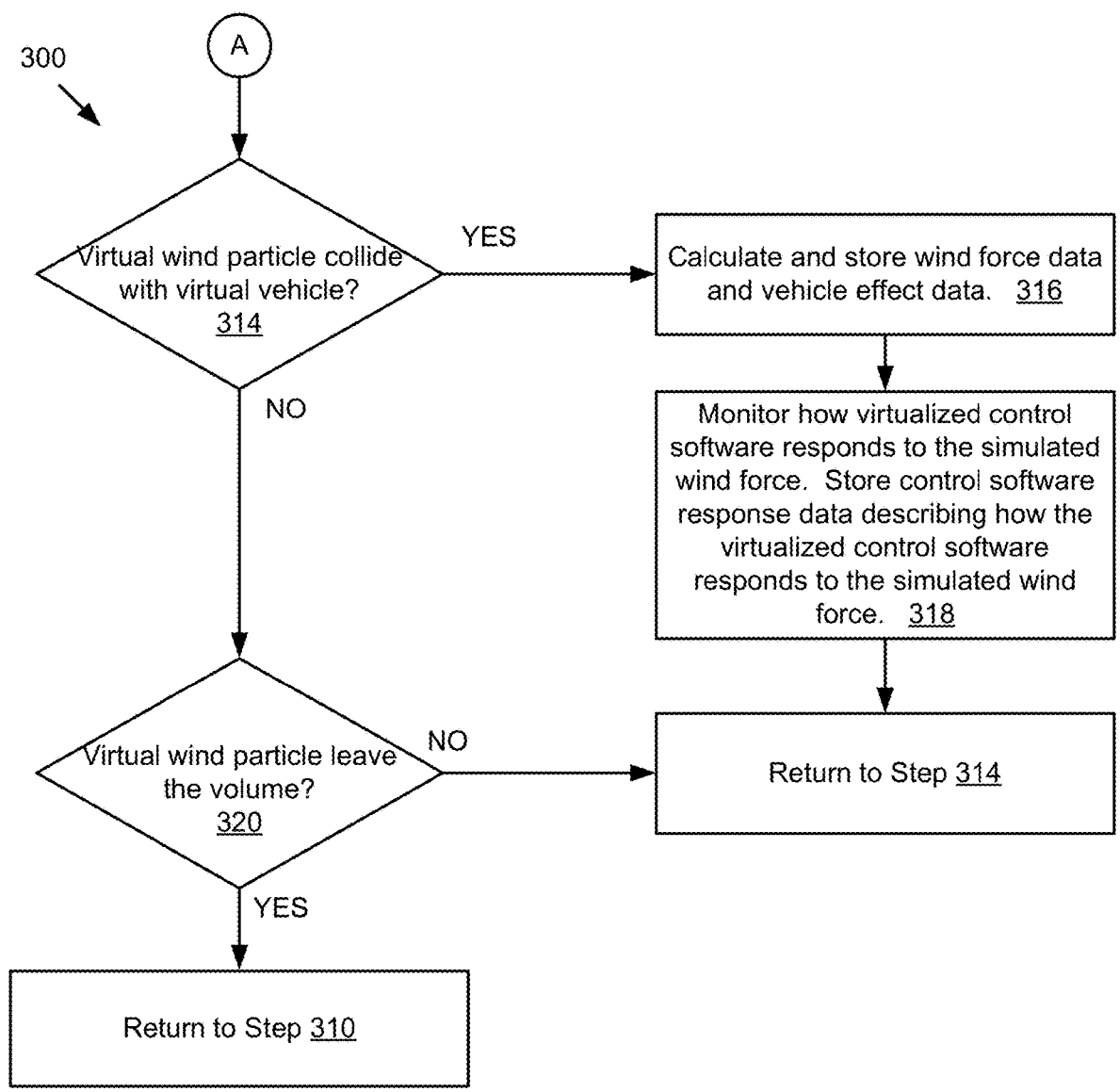

FIGS. 3A and 3B are a flowchart of an example method 300 for generating a virtual wind particle for inclusion in a simulation for testing a design of a real world vehicle including vehicle control software, according to some implementations.

At step 301, a user input GUI may be generated.

At step 302, user input data, vehicle model data, control software model data and roadway model data may be received.

At step 304 the wind model data is built based on the user input data.

At step 306 a GUI depicting a simulation is generated. The simulation may include one or more of the following: a virtual vehicle; a virtualized control software; a virtual roadway environment including a virtual roadway system; and one or more virtual wind particles.

At step 308 the particle force data is calculated. The particle force may describe a force or wind load of a virtual wind particle. The particle force may describe a vector including a direction of the one or more virtual wind particles.

At step 310 a volume of analysis is monitored to determine whether a virtual wind particle is within the volume of analysis. For example, referring FIG. 4, the line segments that form one or more outer edges of the volume of analysis 410 may be monitored to determine whether the virtual wind particle has crossed the outer edge to enter inside the volume of analysis.

Referring back to FIG. 3A, at step 312 a determination may be made regarding whether the virtual wind particle is inside of the volume of analysis. If the virtual wind particle is not within the volume of analysis, then the method 300 moves back to step 310. If the virtual wind particle is within the volume of analysis, then the method moves to step 314 depicted in FIG. 3B.

Referring now to FIG. 3B, at step 314 a determination is made regarding whether the wind particle has collided with the virtual vehicle. If the virtual wind particle has not collided with the virtual vehicle, then the method 300 moves to step 320. If the virtual wind particle has collided with the virtual vehicle, then the method moves to step 316.

At step 316 the wind force data and the vehicle effect data are calculated and stored in a non-transitory memory.

At step 318 the virtualized control software is monitored to determine how the virtualized control software responds to the simulated wind force or wind load. Control software response data may be generated and stored that describes how the virtualized control software responded to the simulated wind force or wind load. The method 300 may then return to step 314.

At step 320 a determination may be made regarding whether the virtual wind particle has left the volume of analysis. If the virtual wind particle has not left the volume of analysis, then the method 300 may return to step 314. If the virtual wind particle has left the volume of analysis, then the method may return to step 310.

Example GUIs

FIG. 4 is an example of a GUI 400 depicting a volume of analysis 410, according to some implementations.

The GUI 400 may include an "input GUI" according to some implementations.

The GUI 400 may depict a virtual roadway environment including a virtual roadway system and a virtual vehicle traveling on the virtual roadway system.

FIG. 5 is an example of a GUI 500 depicting a simulation including a plurality 520 of virtual wind particles, according to some implementations.

The GUI 500 may include an "output GUI" according to some implementations.

The GUI 500 may depict a simulation including a virtual roadway environment including a virtual roadway system 510, a virtual vehicle 505 traveling on the virtual roadway system 510 and a plurality 520 of virtual wind particles. Element 515 includes a virtual wind particle that is within the volume of analysis 410 depicted in FIG. 4. Referring back to FIG. 5, element 525 may include a virtual wind particle that has collided with the virtual vehicle to result in a simulated wind force or wind load that acts to modify a course or trajectory of the virtual vehicle. The virtualized control software may detect the simulated wind force or the wind load and modify one or more operations of the virtual vehicle (e.g., modify the steering of the virtual vehicle) to correct for the effect of the wind force or the wind load.

In some implementations, the virtualized control software may correct for the wind load or the wind force so that the course or trajectory of the virtual vehicle is not modified by the wind force, thereby indicating that the virtualized control software is well designed to respond to wind forces or wind loads. This may indicate that the vehicle control software represented by the virtualized control software has passed a test.

The virtual roadway environment may include virtual roadway lines 530, 535 that are separated from each other in the virtual roadway environment at a distance that replicates the real world (e.g., about 3.5 meters). In some implementations, the wind simulation device 199 may determine that the vehicle control software represented by the virtualized control software has passed a test if the virtualized vehicle does not cross one of the virtual roadway lines 530, 535 responsive to being collided with by one or more virtual wind particles.

In some implementations, the virtual roadway environment may include one or more virtual static objects or virtual static objects. In some implementations, the wind simulation device 199 may determine that the vehicle control software represented by the virtualized control software has passed a test if the virtualized vehicle does not cross one of the virtual roadway lines 530, 535 or strike any virtual static objects or virtual dynamic objects responsive to being collided with by one or more virtual wind particles.

In the above description, for purposes of explanation, numerous specific details are set forth in order to provide a thorough understanding of the specification. It will be apparent, however, to one skilled in the art that the disclosure can be practiced without these specific details. In some instances, structures and devices are shown in block diagram form in order to avoid obscuring the description. For example, the present implementations can be described above primarily with reference to user interfaces and particular hardware. However, the present implementations can apply to any type of computing device that can receive data and commands, and any peripheral devices providing services.

Reference in the specification to "some implementations" or "some instances" means that a particular feature, structure, or characteristic described in connection with the implementations or instances can be included in at least one implementation of the description. The appearances of the phrase "in some implementations" in various places in the specification are not necessarily all referring to the same implementations.

Some portions of the detailed descriptions that follow are presented in terms of algorithms and symbolic representations of operations on data bits within a computer memory. These algorithmic descriptions and representations are the means used by those skilled in the data processing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussion, it is appreciated that throughout the description, discussions utilizing terms including "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

The present implementations of the specification can also relate to an apparatus for performing the operations herein. This apparatus may be specially constructed for the required purposes, or it may include a general-purpose computer selectively activated or reconfigured by a computer program stored in the computer. Such a computer program may be stored in a computer-readable storage medium, including, but is not limited to, any type of disk including floppy disks, optical disks, CD-ROMs, and magnetic disks, read-only memories (ROMs), random access memories (RAMs), EPROMs, EEPROMs, magnetic or optical cards, flash memories including USB keys with non-volatile memory, or any type of media suitable for storing electronic instructions, each coupled to a computer system bus.

The specification can take the form of some entirely hardware implementations, some entirely software implementations or some implementations containing both hardware and software elements. In some preferred implementations, the specification is implemented in software, which includes, but is not limited to, firmware, resident software, microcode, etc.

Furthermore, the description can take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

A data processing system suitable for storing or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including, but not limited, to keyboards, displays, pointing devices, etc.) can be coupled to the system either directly or through intervening I/O controllers.

Network adapters may also be coupled to the system to enable the data processing system to become coupled to other data processing systems or remote printers or storage devices through intervening private or public networks. Modems, cable modem, and Ethernet cards are just a few of the currently available types of network adapters.

Finally, the algorithms and displays presented herein are not inherently related to any particular computer or other apparatus. Various general-purpose systems may be used with programs in accordance with the teachings herein, or it may prove convenient to construct more specialized apparatus to perform the required method steps. The required structure for a variety of these systems will appear from the description below. In addition, the specification is not described with reference to any particular programming language. It will be appreciated that a variety of programming languages may be used to implement the teachings of the specification as described herein.

The foregoing description of the implementations of the specification has been presented for the purposes of illustration and description. It is not intended to be exhaustive or to limit the specification to the precise form disclosed. Many modifications and variations are possible in light of the above teaching. It is intended that the scope of the disclosure be limited not by this detailed description, but rather by the claims of this application. As will be understood by those familiar with the art, the specification may be embodied in other specific forms without departing from the spirit or essential characteristics thereof. Likewise, the particular naming and division of the modules, routines, features, attributes, methodologies, and other aspects are not mandatory or significant, and the mechanisms that implement the specification or its features may have different names, divisions, or formats. Furthermore, as will be apparent to one of ordinary skill in the relevant art, the modules, routines, features, attributes, methodologies, and other aspects of the disclosure can be implemented as software, hardware, firmware, or any combination of the three. Also, wherever a component, an example of which is a module, of the specification is implemented as software, the component can be implemented as a standalone program, as part of a larger program, as a plurality of separate programs, as a statically or dynamically linked library, as a kernel-loadable module, as a device driver, or in every and any other way known now or in the future to those of ordinary skill in the art of computer programming. Additionally, the disclosure is in no way limited to implementation in any specific programming language, or for any specific operating system or environment. Accordingly, the disclosure is intended to be illustrative, but not limiting, of the scope of the specification, which is set forth in the following claims.

What is claimed is:

1. A method comprising:
    generating, by a wind simulation module executed by a processor, a wind model that includes software for virtualizing a wind particle;
    generating, by a virtual simulation tool executed by the processor, a simulation that tests a performance of a vehicle design, the simulation including a virtual roadway environment, a virtual wind particle that is configured by the wind model to be variable and dynamic within the virtual roadway environment when the simulation is executed, a virtual vehicle and a virtualized control software for controlling an operation of the virtual vehicle in the virtual roadway environment; and
    modifying the operation of the virtual vehicle in response to the virtual wind particle in the simulation.

2. The method of claim 1, wherein the wind simulation module is an element of the virtual simulation tool, the wind simulation module is based on user input data, and the user input data describes (1) the wind particle and (2) box data describing a volume of analysis that includes a three dimensional volume inside of the virtual roadway environment and the volume of analysis includes the virtual vehicle but not all of the virtual roadway environment.

3. The method of claim 2, further comprising:
    executing the simulation so that the virtual vehicle, the virtualized control software and the virtual wind particle are dynamic in the virtual roadway environment; and
    monitoring, by the wind simulation module, an outer edge of the volume of analysis to determine whether the virtual wind particle is present inside the volume of analysis.

4. The method of claim 3, wherein the outer edge is configured so that the wind simulation module monitors less of the virtual roadway environment so that the test of the virtualized control software requires less computations than monitoring each pixel of the virtual roadway environment.

5. The method of claim 3, further comprising:
    responsive to detecting the virtual wind particle being present inside the volume of analysis, tracking the virtual wind particle to determine whether the virtual wind particle collides with the virtual vehicle;

detecting the virtual wind particle collide with the virtual vehicle; and determining (1) wind force data describing a simulated wind force caused by the virtual wind particle colliding with the virtual vehicle and (2) vehicle effect data describing an effect of the simulated wind force on the virtual vehicle.

6. The method of claim 5, further comprising:

monitoring a response of the virtualized control software to the effect of the simulated wind force on the virtual vehicle; and storing control software response data describing the response.

7. The method of claim 1, wherein the vehicle design is for an Advanced Driver Assistance System (ADAS system) of an autonomous vehicle and the method further comprises:

determining that the virtualized control software failed to meet one or more requirements of a specification for the ADAS system of the autonomous vehicle represented in the simulation by the virtualized control software; and modifying the vehicle design based on the virtualized control software failing to meet the one or more requirements of the specification for the ADAS system such that the autonomous vehicle will be built with a modified vehicle design that changes a trajectory of the autonomous vehicle to correct for wind load.

8. The method of claim 7, wherein modifying the vehicle design improves a performance of the ADAS system.

9. A non-transitory memory comprising computer code which, when executed by a processor, causes the processor to perform steps comprising:

generating a wind model that includes software for virtualizing a wind particle;

generating a simulation that tests a performance of a vehicle design, the simulation including a virtual roadway environment, a virtual wind particle that is configured by the wind model to be variable and dynamic within the virtual roadway environment when the simulation is executed, a virtual vehicle and a virtualized control software for controlling an operation of the virtual vehicle in the virtual roadway environment; and modifying the operation of the virtual vehicle in response to the virtual wind particle in the simulation, wherein the simulation is operable to test the virtualized control software and the modifying of the operation of the virtual vehicle in response to the virtual wind particle in the simulation.

10. The non-transitory memory of claim 9, wherein the computer code, when executed by the processor, causes the processor to perform additional steps comprising:

receiving user input data that includes; box data describing a volume of analysis that includes a three dimensional volume inside of the virtual roadway environment and the volume of analysis includes the virtual vehicle but not all of the virtual roadway environment executing the simulation so that the virtual vehicle, the virtualized control software and the virtual wind particle are dynamic in the virtual roadway environment; and monitoring an outer edge of the volume of analysis to determine whether the virtual wind particle is present inside the volume of analysis.

11. The non-transitory memory of claim 10, wherein the outer edge is configured so that less of the virtual roadway environment is monitored so that the test of the virtualized control software requires less computations than monitoring each pixel of the virtual roadway environment.

12. The non-transitory memory of claim 10, wherein the computer code, when executed by the processor, causes the processor to perform additional steps comprising:

responsive to detecting the virtual wind particle being present inside the volume of analysis, tracking the virtual wind particle to determine whether the virtual wind particle collides with the virtual vehicle;

detecting the virtual wind particle collide with the virtual vehicle; and determining (1) wind force data describing a simulated wind force caused by the virtual wind particle colliding with the virtual vehicle and (2) vehicle effect data describing an effect of the simulated wind force on the virtual vehicle.

13. The non-transitory memory of claim 12, wherein the computer code, when executed by the processor, causes the processor to perform additional steps comprising:

monitoring a response of the virtualized control software to the effect of the simulated wind force on the virtual vehicle; and storing control software response data describing the response.

14. The non-transitory memory of claim 13, wherein the computer code, when executed by the processor, causes the processor to output a graphical user interface that depicts the control software response data.

15. The non-transitory memory of claim 9, wherein the vehicle design is for an Advanced Driver Assistance System (ADAS system) of an autonomous vehicle and wherein the steps further include:

determining that the virtualized control software failed to meet one or more requirements of a specification for the ADAS system of the autonomous vehicle represented in the simulation by the virtualized control software; and modifying the vehicle design based on the virtualized control software failing to meet the one or more requirements of the specification for the ADAS system such that the autonomous vehicle will be built with a modified vehicle design that changes a trajectory of the autonomous vehicle to correct for wind load.

16. A system comprising:

a processor, a monitor; and a non-transitory memory storing a virtual simulation tool that includes a wind simulation module, wherein the processor is communicatively coupled to the non-transitory memory to execute the virtual simulation tool and the wind simulation module and generate an output for display on the monitor;

wherein, responsive to being executed by the processor, the wind simulation module causes the processor to generate a wind model that includes software for virtualizing a wind particle;

wherein, responsive to being executed by the processor, the virtual simulation tool generates a simulation for display on the monitor, the simulation testing a performance of a vehicle design and including a virtual roadway environment, a virtual wind particle that is configured by the wind model to be variable and dynamic within the virtual roadway environment of the simulation, a virtual vehicle and a virtualized control software for controlling an operation of the virtual vehicle in the virtual roadway environment and modifying the operation of the virtual vehicle in response to a variable in the simulation, wherein the simulation is operable to test the virtualized control software and the modifying of the operation of the virtual vehicle in response to the virtual wind particle being the variable in the simulation.

17. The system of claim 16, wherein the wind simulation module is a plug-in included in the virtual simulation tool.

18. The system of claim 16, wherein the virtual simulation tool is a Modelica-based simulation tool.

19. The system of claim 16, wherein the wind simulation module receives user input data that includes box data describing a volume of analysis that includes a three dimensional volume inside of the virtual roadway environment and the volume of analysis includes the virtual vehicle but not all of the virtual roadway environment and monitors the volume of analysis by monitoring an outer edge of the volume of analysis to determine whether the virtual wind particle is present inside the volume of analysis.

20. The system of claim 19, wherein the outer edge is configured so that the wind simulation module monitors less of the virtual roadway environment so that the test of the virtualized control software requires less computations than monitoring each pixel of the virtual roadway environment.

* * * * *